United States Patent
Yamaguchi et al.

(10) Patent No.: US 6,460,001 B1
(45) Date of Patent: Oct. 1, 2002

(54) APPARATUS FOR AND METHOD OF MEASURING A PEAK JITTER

(75) Inventors: Takahiro Yamaguchi; Masahiro Ishida, both of Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/538,135

(22) Filed: Mar. 29, 2000

(51) Int. Cl.[7] ................................................ G06F 19/00
(52) U.S. Cl. ........................ 702/69; 375/226; 375/359; 375/360; 375/371; 324/622; 331/4
(58) Field of Search .................. 702/69, 1, 66, 702/57; 331/4; 375/130, 371, 226, 359, 360; 324/622

(56) References Cited

U.S. PATENT DOCUMENTS 3,737,766 A * 6/1973 Lubarsky, Jr. ............... 324/57
5,255,202 A * 10/1993 Kido et al. .................. 364/483
6,185,510 B1 * 2/2001 Inoue .......................... 702/69
6,298,315 B1 * 10/2001 Li et al. ...................... 702/180

* cited by examiner

Primary Examiner—Marc S. Hoff
(74) Attorney, Agent, or Firm—David N. Lathrop, Esq.; Gallagher & Lathrop

(57) ABSTRACT

An input clock signal is transformed into a complex analytic signal $z_c(t)$ by an analytic signal transforming means 13 and an instantaneous phase of its real part $x_c(t)$ is estimated using the analytic signal $z_c(t)$. A linear phase is removed from the instantaneous phase to obtain a phase noise waveform $\Delta\phi(t)$. A peak value $\Delta\phi_{max}$ of absolute values of the $\Delta\phi(t)$ is obtained, and $4\Delta\phi_{max}$ is defined as the worst value of period jitter of the input signal. The $\Delta\phi(t)$ is sampled at a timing close to a zero-crossing point of the $x_c(t)$ to extract the sample value. A differential between adjacent samples is obtained in the sequential order to calculate a root-mean-square value of the differentials (period jitters). An $\exp(-(2\Delta\phi_{max})^2/(2\sigma_j^2))$ is calculated from the mean-square value $\sigma_j$ and $2\Delta\phi_{max}$, and the calculated value is defined as a probability that a period jitter exceeds $2\Delta\phi_{max}$.

13 Claims, 8 Drawing Sheets

| Operating mode | TIA | Δφ Method | | Worst Case | |
|---|---|---|---|---|---|
| | $J_{PP}$ | $\Delta\phi_P$ (PM only) | $\Delta\phi_P$ (PM+AM) | $J_{PP}$ | $Pr(J_p)$ |
| Quiet | 57.4 ps 36.0 ps | 31.2 ps | 25.7 ps | 125 ps | 2.1e-10 |
| Noisy | 257 ps 106.2 ps | 56.7 ps | 58.0 ps | 232 ps | 1.4e-12 |
| Number of Events | 102000 500 | 997 | 997 | 997 | --- |

APPARATUS FOR AND METHOD OF MEASURING A PEAK JITTER

BACKGROUND OF THE INVENTION

The present invention relates to an apparatus and a method that are applied to a measurement of a jitter of, for example, a microprocessor clock, and are used for estimating a fluctuation of a zero crossing interval of an input signal and a peak jitter (period jitter), particularly for estimating a worst value of peak jitter and its occurrence probability.

A clock frequency of microprocessor is doubled in every forty months. The shorter a clock period is, the more severe jitter measurement is required. This is because a timing error in the system operation must be avoided.

Incidentally, there are two types of jitters, i.e., a period jitter and a timing jitter. A period jitter becomes a problem since, in a computer clock for example, an upper limit of its operation frequency is determined by a period jitter. As shown in FIG. 1A, in a jitter-free ideal clock signal, for example, an interval $T_{int}$ between adjacent rising points is constant as indicated by a dotted line waveform, and in this case a period jitter is zero. In an actual clock signal, a rising edge fluctuates from an arrow toward leading side or trailing side, i.e., an interval $T_{int}$ between adjacent rising points fluctuates, and this fluctuation of the interval is a period jitter. For example, in the case of a sine wave that does not have a rectangular waveform like a clock signal, a fluctuation of an interval $T_{int}$ between zero-crossing points is also a period jitter. A period jitter becomes a problem of computer clocks.

On the other hand, a timing jitter is defined as the timing deviation from an ideal point in, for example, data communication. As shown in FIG. 1B, when a jitter-free square waveform is assumed to be a dashed line waveform, a deviation width $\Delta\phi$ of an actual rising point (solid line) from a normal rising point (dashed line) is a timing jitter in the case of a jittery square waveform.

A conventional measurement of a period jitter is performed by a time interval analyzer (hereinafter, this measuring method is referred to as a time interval method or a TIA method). This is shown in "Phase Digitizing Sharpens Timing Measurements" by David Chu, IEEE Spectrum, pp. 28–32, 1988, and "Time Domain Analysis and Its Practical Application to the Measurement of Phase Noise and Jitter", by Lee D. Cosart et al., IEEE Trans. Instrum. Meas., vol.46, pp. 1016–1019, 1997. This time interval method is a method in which zero-crossing points of a signal under test are counted, an elapsed time is measured, and a time fluctuation between zero-crossing points is estimated to obtain a period jitter. In this time interval method, it takes a long time to perform those measurements since data present between zero-crossings are not utilized for the measurements.

There is a method, as a conventional timing jitter measurement, in which a timing jitter is measured in frequency domain using a spectrum analyzer. Since, in this method, a low frequency range is swept to measure a phase noise spectrum, it takes approximately 10 minutes or so for the measurement.

From those view points, inventors of the present invention have proposed a method of measuring a jitter as described below in an article entitled "an application of an instantaneous phase estimating method to a jitter measurement" in a technical report "Probo" pp. 9–16 issued by Probo Editorial Room of ADVANTEST CORPORATION, Nov. 12, 1999.

That is, as shown in FIG. 2, an analog clock waveform from a PLL circuit under test (Phase locked loop) 11 is converted into a digital clock signal $x_c(t)$ by an digital-analog converter 12, and the digital clock signal $x_c(t)$ is supplied to a Hilbert pair generator 14 acting as analytic signal transforming means 13, where the digital clock signal $x_c(t)$ is transformed into an analytic signal $z_c(t)$.

Now, a clock signal $x_c(t)$ is defined as follows.

$$x_c(t)=A_c \cos(2\pi f_c t+\theta_c+\Delta\phi(t))$$

The $A_c$ and the $f_c$ are nominal values of amplitude and frequency of the clock signal respectively, the $\theta_c$ is an initial phase angle, and the $\Delta\phi(t)$ is a phase fluctuation that is called a phase noise.

The clock signal $x_c(t)$ is Hilbert-transformed by a Hilbert transformer 15 in the Hilbert pair generator 14 to obtain the following equation.

$$\hat{x}_c(t)=H[x_c(t)]=A_c \sin(2\pi f_c t+\theta_c+\Delta\phi(t))$$

Then, an analytic signal $z_c(t)$ having $x_c(t)$ and $\hat{x}_c(t)$ as a real part and an imaginary part, respectively is obtained as follows.

$$\begin{aligned}z_c(t) &= x_c(t) + \hat{x}_c(t) \\ &= A_c\cos(2\pi f_c t + \theta_c + \Delta\phi(t)) + jA_c\sin(2\pi f_c t + \theta_c + \Delta\phi(t))\end{aligned}$$

From this analytic signal $z_c(t)$, an instantaneous phase $\Theta(t)$ of the clock signal $x_c(t)$ can be estimated by the instantaneous phase estimator 16 as follows.

$$\Theta(t)=[2\pi f_c t+\theta_c+\Delta\phi(t)] \bmod 2\pi$$

A linear phase is removed from this instantaneous phase $\Theta(t)$ by a linear phase remover 17 to obtain a phase noise waveform $\Delta\phi(t)$. That is, in the linear phase remover 17, a continuous phase converting part 18 applies a phase unwrap method to the instantaneous phase $\Theta(t)$ to obtain a continuous phase $\theta(t)$ as follows.

$$\theta_c(t)=2\pi f_c t+\theta_c+\Delta\phi(t)$$

The phase unwrap method is shown in "A New Phase Unwrapping Algorithm" by Jose M. Tribolet, IEEE Trans. Acoust., Speech, Signal Processing, vol. ASSP-25, pp. 170–177, 1977 and in "On Frequency-Domain and Time-Domain Phase Unwrapping" by Kuno P. Zimmermann, Proc. IEEE. vol. 75, pp. 519–520, 1987.

A linear phase $[2\pi f_c t+\theta_c]$ of a continuous phase $\theta(t)$ is estimated by a linear phase evaluator 19 using a linear trend estimating method. This estimated linear phase $[2\pi f_c t+\theta_c]$ is subtracted from the continuous phase $\theta(t)$ by a subtractor 21 to obtain a variable term $\Delta\phi(t)$ of the instantaneous phase $\Theta(t)$, i.e., phase noise waveform as follows.

$$\theta(t)=\Delta\phi(t)$$

The phase noise waveform $\Delta\phi(t)$ thus obtained is inputted to a peak-to-peak detector 22, where a difference between the maximum peak value max $(\Delta\phi(k))$ and the minimum peak value min $(\Delta\phi(l))$ of the $\Delta\phi(t)$ is calculated to obtain a peak value $\Delta\phi_{pp}$ of timing jitters as follows.

$$\Delta\phi_{pp} = \max_k(\Delta\phi(k)) - \min_l(\Delta\phi(l))$$

In addition, the phase noise waveform $\Delta\phi(t)$ is inputted to a root-mean-square detector 23, where a root-mean-square value of the phase noise waveform $\Delta\phi(t)$ is calculated using following equation to obtain a root-mean-square value $\Delta\phi_{RMS}$ of timing jitters.

$$\Delta\phi_{RMS} = \sqrt{\frac{1}{N}\sum_{k=0}^{N-1}\Delta\phi^2(k)}$$

A method is called the $\Delta\phi$ method since it estimates a peak value of timing jitters and/or a root-mean-square value of timing jitters from the phase noise waveform $\Delta\phi(t)$. According to the $\Delta\phi$ method, a jitter measurement can be performed in a test time of 100 millisecond order since measuring points are not limited to zero-crossing points. Further, in FIG. 2, the analytic signal transforming means 13, the instantaneous phase estimator 16 and the linear phase remover 17 compose phase noise detecting means 25.

As mentioned above, it is important, for example in manufacturing computers, to know whether or not the computer can operate even in the worst peak value case of period jitter in the operation clock, namely in the worst case condition that has both the maximum time interval between adjacent rising edges of a clock and the minimum time interval between adjacent rising edges of a clock. From this point of view, it is requested to measure the worst period jitter value of a microprocessor to be used in a computer and to perform a test in a short time to see whether or not the microprocessor is defective based on whether the worst period jitter value is equal to or less than a predetermined value.

However, according to the conventional time interval method, a time interval between adjacent zero-crossings is measured to estimate its fluctuation, and each period jitter value occurs as a random variable. Therefore, when the worst value of period jitters is measured, an accurate value cannot be obtained unless period jitters of a signal under test are measured for a long time. Therefore, in the conventional method, it is actually difficult to test, for example, whether or not a manufactured microprocessor is a non-defective chip having the worst period jitter value of a clock equal to or less than a predetermined value.

In addition, it is effective as a factor for evaluating the product reliability of a microprocessor to estimate an occurrence probability of the worst period jitter value of its clock. However, in the conventional method, it is difficult to obtain a peak value of period jitter at high speed, and hence the occurrence probability of a peak value of period jitter has not even been defined.

It is another object of the present invention to provide an apparatus for and a method of measuring a peak jitter that can estimate an occurrence probability of each period jitter value in relatively short time.

It is another object of the present invention to provide an apparatus for and a method of measuring a peak jitter that can obtain an occurrence probability of each period jitter value in relatively short time.

Prior to the description of the present invention, the principle of the present invention will be explained. In a narrow-band random process $\{J(nT)\}$, when a certain instantaneous value follows Gaussian distribution, a set of its peak values, namely a set of the maximum values of absolute values of $J(nT)$, i.e., $\{max[abs(J(nT))]\}$ becomes closer to Rayleigh distribution when a degree of freedom n (the number of samples) is made large. This principle is explained in, for example, "Random Data: Analysis and Measurement Procedure" by J. S. Bendat and A. G. Piersol, 2 nd ed, P542, John Wiley & Sons, Inc, 1986, or in "An Introduction to Random Vibrations, Spectral & Wavelet Analysis" by D. E. Newland, P90~92, Longman Scientific & Technical, 1993.

FIG. 3 shows a power spectrum obtained by performing fast-Fourier-transforming on the clock waveform of a microprocessor of a PC (personal computer). FIG. 3A shows a case of quiet mode, i.e., a case of non-active state of a microprocessor. In the non-active state, when the personal computer waits for a user instruction, only a PLL circuit outputting a clock signal activated giving reference clock edges from a reference clock generator wherein the best state that the clock is not influenced by the operation of the personal computer is provided. FIG. 3B shows a case of noisy mode, i.e., a case of extremely active state of a microprocessor. In the noisy mode, a level 2 memory, system and core buses, and branch predictor units in a personal computer are all in full activated, wherein a state that the clock is most influenced by the operation of the personal computer is provided.

In either FIG. 3A or 3B, a line spectrum of the clock appears at 400 MHz (fundamental frequency of the clock), and random phase noises are observed in the sidebands close to 400 MHz as a central frequency. This shows a presence of narrow-band random data.

On the other hand, a probability density function (histogram) of a clock jitter follows Gaussian distribution as shown in FIG. 4. FIG. 4A shows a case of the quiet mode, and FIG. 4B shows a case of the noisy mode. Since those random phase noises are present, and since those random phase noises, i.e., instantaneous values of clock jitter follow Gaussian distribution, a set of peak period jitter values (peak jitter) of the clock, i.e., $\{max[abs(J(nT))]\}$ follows Rayleigh distribution.

It is known that a probability density function of Rayleigh distribution $P(J_p)$ is given by the following equations.

$$P(J_p) = \frac{J_p}{\sigma_J^2}\exp\left(-\frac{J_p^2}{2\sigma_J^2}\right) \quad J_p > 0 \qquad (1)$$
$$0 \qquad J_r > 0$$

In this case, $\sigma_J$ is a root-mean-square value of peak values $J_p$.

In addition, it is also known that a probability that a peak value $J_p$ becomes larger than a certain value $\hat{J}p$ (right-tail probability) is given by the following equation.

$$P_r(J_p > \hat{J}_P) = \int_{\hat{J}_p}^{\infty}P(J_p)dJ_p \qquad (2)$$
$$= \exp\left(-\frac{\hat{J}_p^2}{2\sigma_J^2}\right)$$

As clearly explained above, a set of peak period jitter values $\{max[abs(J_p)]\}$ follows Rayleigh distribution. Rayleigh distribution is described in "Fundamentals of Statistical Signal Processing: Detection Theory" by S. M. Kay, Prentice-Hall, Inc. 1998, PP. 30~31.

Therefore, the equations (1) and (2) can be applied to a set of peak period jitter values $\{max[abs(J_p)]\}$. Consequently, if a positive maximum value (zero-peak value) of peak jitter fluctuation is $\hat{J}_{pk}$, a probability that a period jitter becomes larger than $\hat{J}_{pk}$ is given by the following equation.

$$P_r(J_p > \hat{J}_{pk}) = \int_{\hat{J}_{pk}}^{\infty}P(J_p)dJ_p \qquad (3)$$

-continued $$= \exp\left(-\frac{\hat{J}_{pk}^2}{2\sigma_J^2}\right)$$

The standard deviation of $\hat{J}_{pk}$ is given by the following equation.

$$\sigma_{J_{pk}} = \sqrt{\frac{4-\pi}{2}}\,\sigma_J \quad (4)$$

That is, when $\hat{J}_{pk}$ is defined as the worst peak value of period jitter, and a root-mean-square value $\sigma_J$ of the jitters of a signal under test and $\hat{J}_{pk}$ are measured, a probability that a period jitter of the signal under test exceeds the worst peak value $\hat{J}_{pk}$ can be estimated. It can also be estimated that the smaller the probability is, the higher the reliability of a product to be processed by the signal under test is. An aspect of the present invention is to estimate a probability of a peak value of period jitter of an input signal based on the above consideration.

Incidentally, in FIG. 1B, when a clock rises at time point 0 (zero) with the maximum delay deviation from an ideal rising point, and rises at next time point T with the maximum lead deviation from the ideal rising point, i.e., when a timing jitter $\Delta\phi(0)$ at time point 0 is the negative maximum value $-\Delta\phi_{max}$, and a timing jitter $\Delta\phi(T)$ at time point T is the positive maximum value $+\Delta\phi_{max}$, a peak jitter becomes the worst value in the positive direction as shown below.

$$J_p'^+ = \Delta\phi_{max} - (-\Delta\phi_{max}) = 2\Delta\phi_{max} \quad (5)$$

Similarly, when a timing jitter $\Delta\phi(0)$ at time point 0 is the positive maximum value $+\Delta\phi_{max}$, and a timing jitter $\Delta\phi(T)$ at time point T is the negative maximum value $-\Delta\phi_{max}$, a peak jitter becomes the worst value in the negative direction as shown below.

$$J_p'^- = -\Delta\phi_{max} - \Delta\phi_{max} = -2\Delta\phi_{max} \quad (6)$$

Therefore, the maximum peak-to-peak value of period jitter, i.e., the worst value $J'_{pp}$ of period jitter is given by the equation below.

$$J_{pp}' = J_p'^+ - J_p'^- = 4\Delta\phi_{max} \quad (7)$$

Further, in general, the maximum value of period jitter in the positive direction is equal to the maximum value of period jitter in the negative direction.

From the relationship described above, in a second aspect of the present invention, the maximum value of timing jitter $\Delta\phi_{max}$ is estimated to make it possible to estimate the worst peak value or the worst value of period jitter in a short time.

SUMMARY OF THE INVENTION

According to one aspect of the present invention, an input signal is transformed into a complex analytic signal, and an instantaneous phase of the analytic signal is obtained. A linear phase is removed from the instantaneous phase to obtain a phase noise waveform, and the maximum value of absolute value of the phase noise waveform is obtained. And the maximum value is multiplied by 2 to obtain the worst peak value of period jitter, or the maximum value is multiplied by 4 to obtain the worst value of period jitter of the input signal.

According to another aspect of the present invention, a phase noise waveform is obtained similarly to the previous case. The worst peak value of the input signal is estimated from the phase noise waveform. In addition, a root-mean-square jitter of period jitters of the input signal is obtained from the phase noise waveform. A probability of period jitter of the input signal is obtained from the worst peak value and the root-mean-square jitter.

DETAILED DESCRIPTION OF THE PREFERRED EMBODIMENTS

Figure 2:
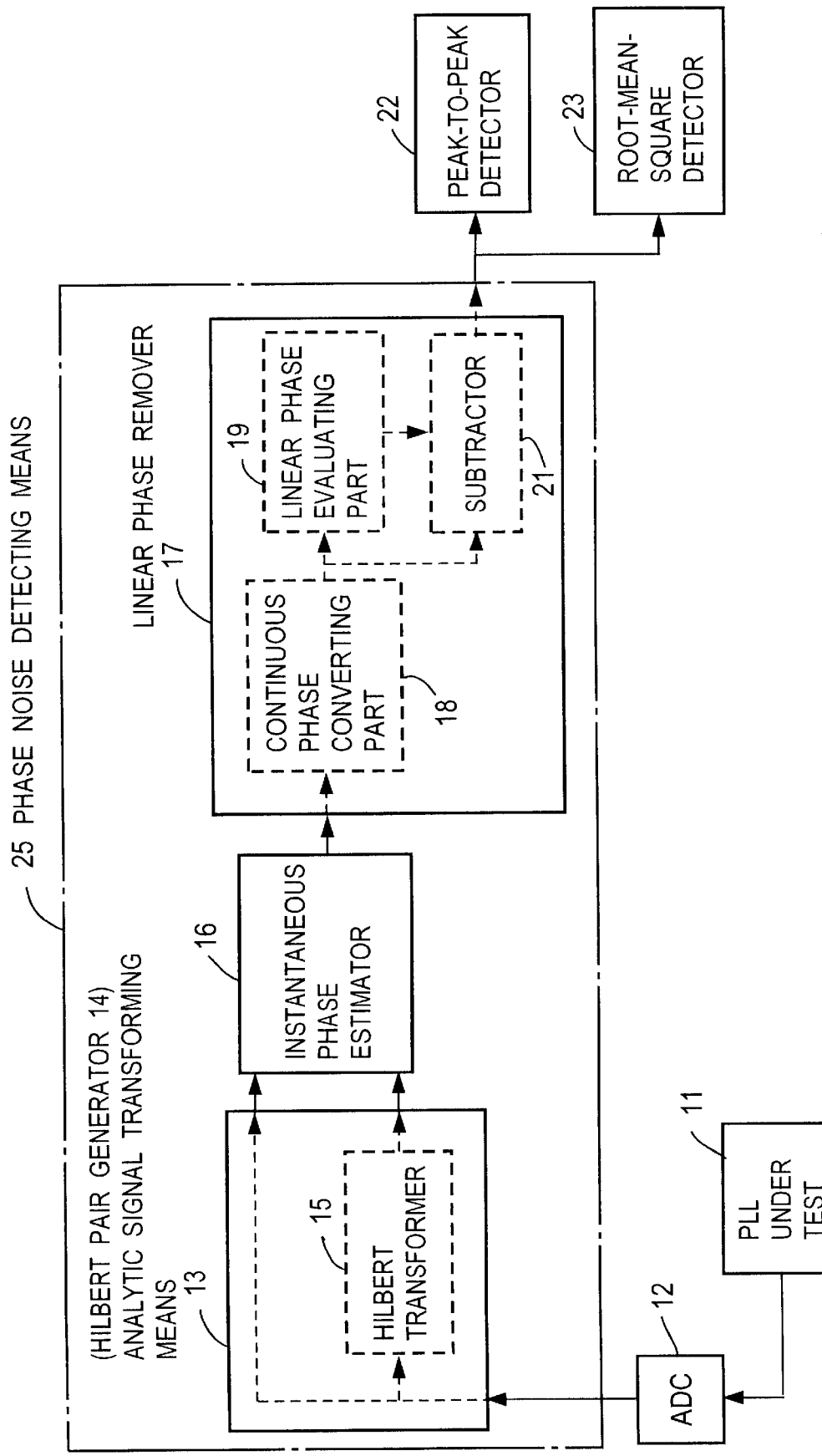
FIG. 2 is a block diagram showing a functional configuration of an apparatus for measuring a jitter based on the proposed $\Delta\phi$ method.
Figure 3A:
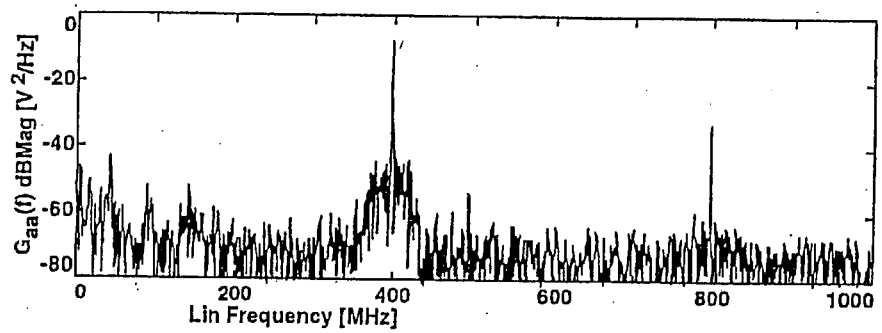
FIG. 3A is a diagram showing a spectrum of a clock in quiet mode.
Figure 3B:
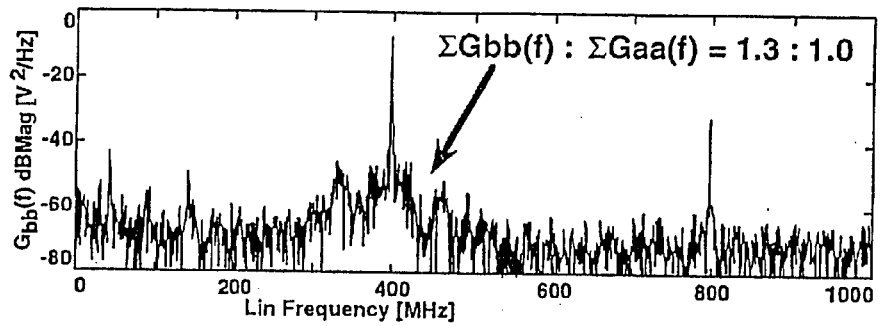
FIG. 3B is a diagram showing a spectrum of a clock in noisy mode.
Figure 4A:
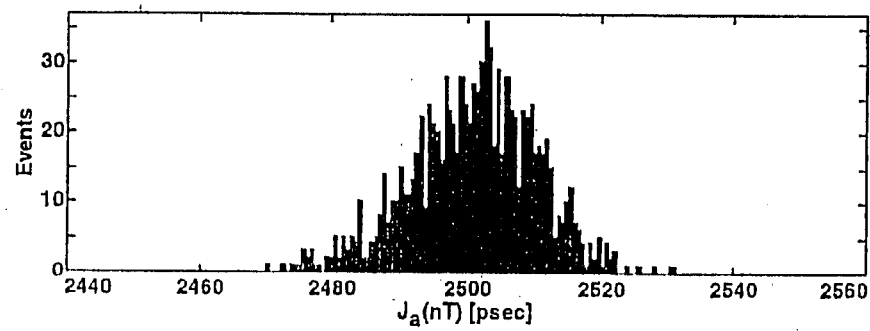
FIG. 4A is a diagram showing a histogram of clock jitter in quiet mode.
Figure 4B:
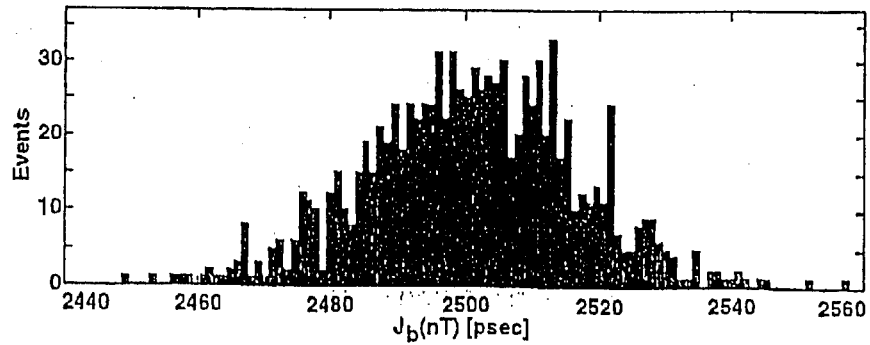
FIG. 4B is a diagram showing a histogram of clock jitter in noisy mode.
Figure 5:
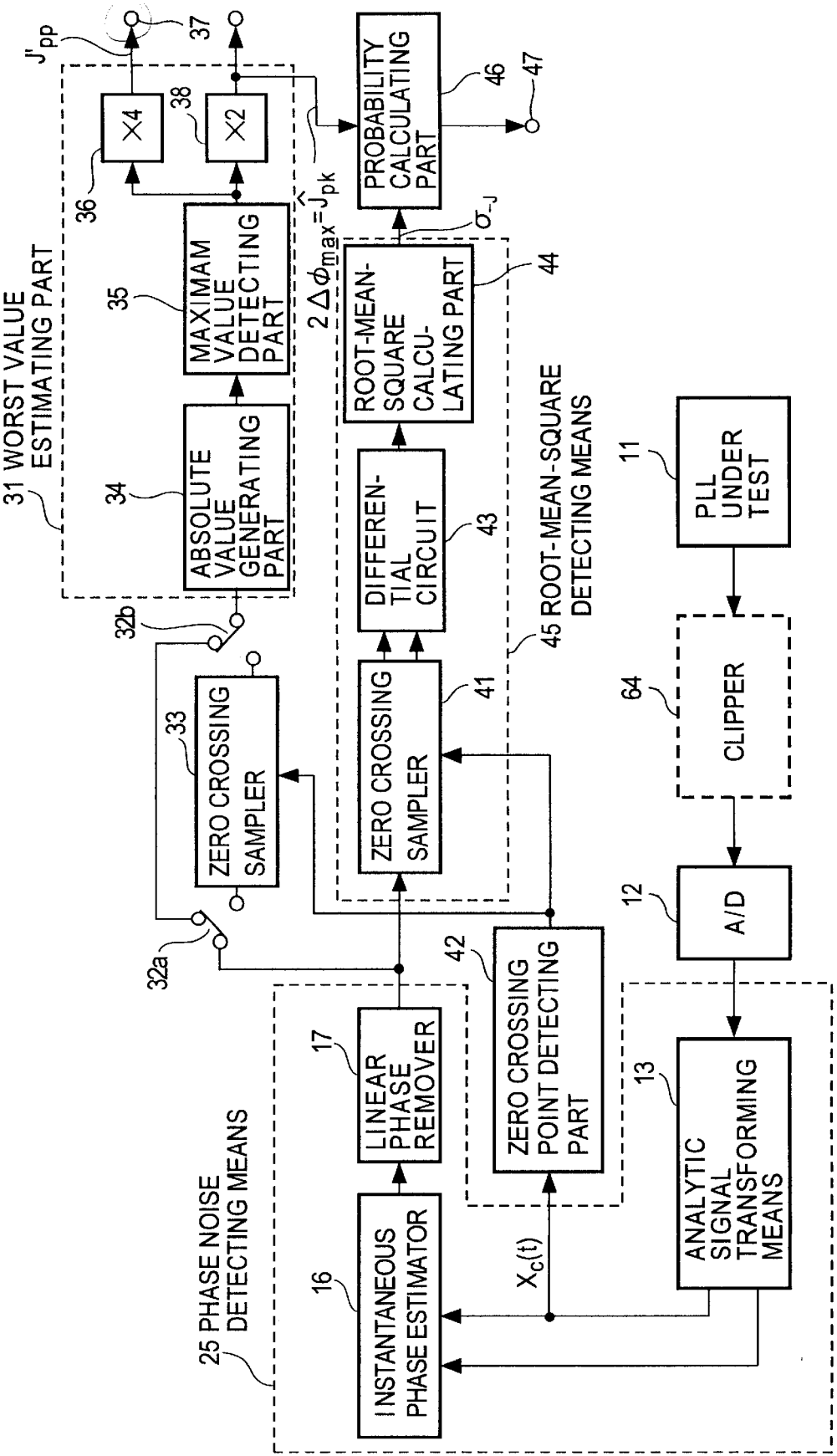
FIG. 5 is a block diagram showing a functional configuration of an embodiment of the present invention.

FIG. 5 shows an embodiment of the present invention. Portions in FIG. 5 corresponding to those in FIG. 2 have the same reference numerals affixed thereto as those in FIG. 2. In this embodiment, a phase noise waveform $\Delta\phi(t)$ obtained from a linear phase remover 17 is supplied to a worst value estimating part 31. This example is a case in which switches 32a and 32b are switched so that the phase noise waveform can be supplied to the worst value estimating part 31 directly or via a zero-crossing sampler 33.

Figure 1A:
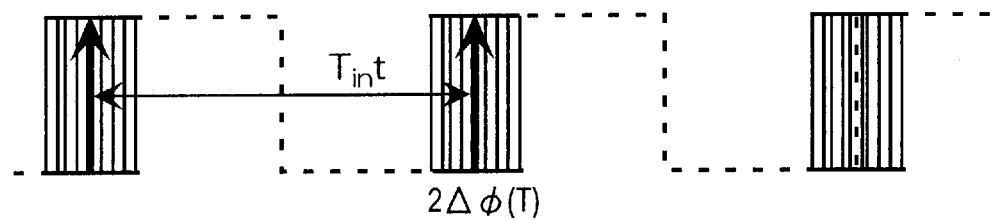
FIG. 1A is a diagram for explaining a period jitter.
Figure 1B:
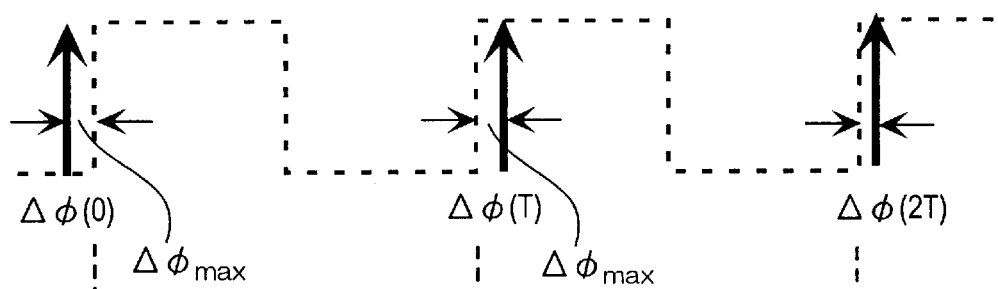
FIG. 1B is a diagram for explaining a timing jitter.
Figure 1C:
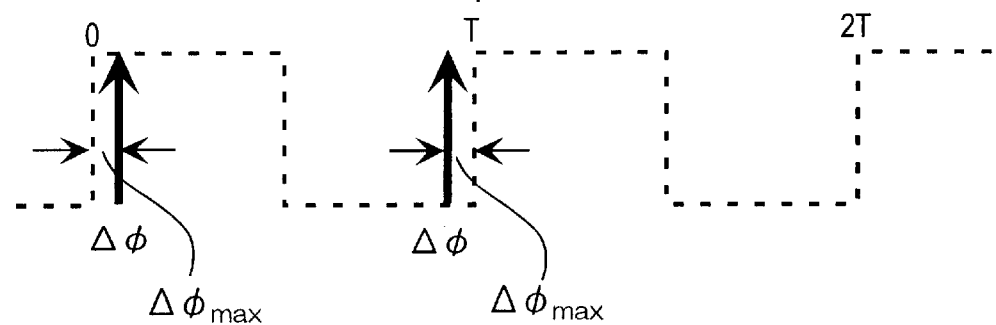
FIG. 1C is a diagram for explaining a relationship between a timing jitter and the minimum peak of period jitter.

In the worst value estimating part 31, the inputted phase noise waveform is converted into an absolute value by an absolute value generating part 34. That is, since the phase noise waveform is a digital data, its sign bit is always made positive, and thereafter the maximum value (peak value) of the phase noise waveform converted into the absolute value is detected by a maximum value detecting part 35. That is, the maximum value $\Delta\phi_{max}$ of timing jitter in FIG. 1 is obtained. The obtained maximum value $\Delta\phi_{max}$ is multiplied by four by a four-multiplying circuit 36 to obtain the worst value $\hat{J}_{pp} = 4\Delta\phi_{max}$ of period jitter of the input signal, and the worst value is outputted to an output terminal 37. As mentioned above, according to the conventional time interval analyzed method, the maximum value of peak-to-peak values, i.e., the worst value $\hat{J}_{pp}$ can be obtained only when an occurrence of the positive maximum peak of period jitter and an occurrence of the negative maximum peak of period jitter are detected. However in this embodiment, when the maximum value $\Delta\phi_{max}$ of timing jitter is obtained, this value can be multiplied by four to estimate the worst value $\hat{J}_{pp}$ of period jitter. The occurrence probability of the maximum value $\Delta\phi_{max}$ is much higher than the occurrence probability of both positive and negative maximum peaks, and hence the worst value $\hat{J}_{pp}$ can be estimated in significantly short time. Further, the maximum value $\Delta\phi_{max}$ may be multiplied by two by a two-multiplying part 38 to obtain $2\Delta\phi_{max}$, and this $2\Delta\phi_{max}$ may be outputted as the worst value (worst peak value) of period jitter of the input signal at an output terminal 39.

Moreover in this embodiment, a probability of a period jitter of an input signal can be estimated. Therefore, a phase noise waveform $\Delta\phi(t)$ is sampled by the zero-crossing sampler 41 at a timing closest to a zero-crossing point of a real part $x_c(t)$ of an analytic signal $z_c(t)$.

Figure 6A:
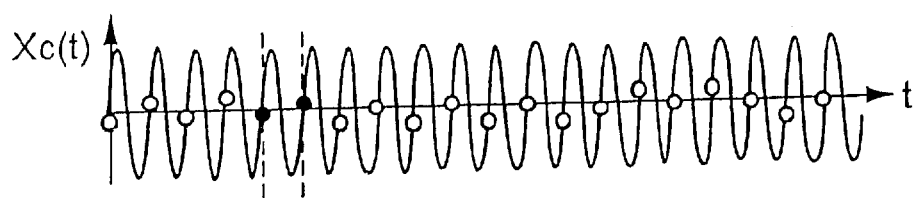
FIG. 6 is a diagram showing a relationship among zero-crossing points of a real part $x_c(t)$, a phase noise waveform and period jitters of an input signal.
Figure 6B:
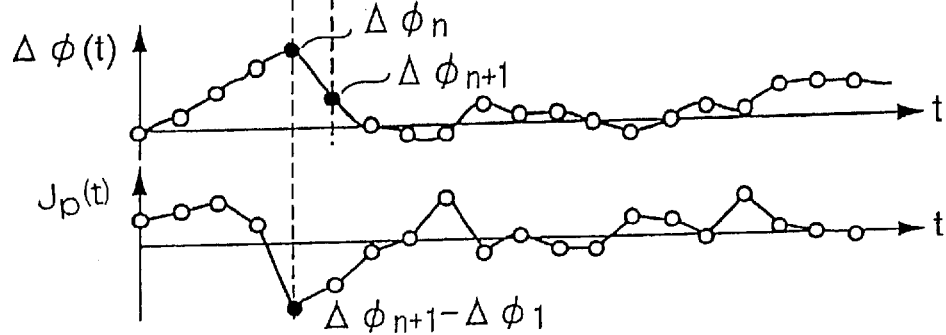
Figure 6C:
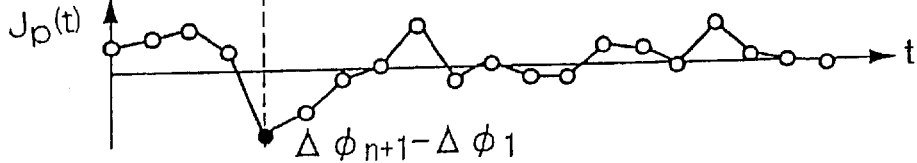

That is, a waveform of a real part $x_c(t)$ of an analytic signal is shown in FIG. 6A, and a sampling point (arithmetic processing point) closest to a zero-crossing point of the rising (or falling) wave of the waveform is detected by the zero-crossing point detecting part 42. In FIG. 6A, a point closest to the detected zero-crossing point is indicated by a mark ○. This point is called an approximate zero-crossing point. As shown in FIG. 6B, a value of the phase noise waveform $\Delta\phi(t)$ indicated by a mark ○ is extracted by a zero-crossing sampler 41 as a sample value at the approximate zero-crossing point. Each of the extracted sample values is a deviated quantity from an ideal timing (zero-crossing point) of a real part $x_c(t)$ of a jitter-free analytic signal. Regarding the sample values of the $\Delta\phi(t)$, when a difference between each sample value and its immediately previous sample value is obtained, this difference corresponds to a fluctuation between zero-crossings, i.e., a period jitter $J_p$. A period jitter $J_p$ can be obtained from nth sample value $\Delta\phi_n$ and (n+1)th sample value $\Delta\phi_{n+1}$ of the $\Delta\phi(t)$ in FIG. 6B as $J_{p=\Delta\phi n+1}-\Delta\phi_n$. The $J_p$ thus obtained is shown in FIG. 6C.

In a differential circuit 43 in FIG. 5B, regarding the sample values from the zero-crossing sampler 41, a difference. between each sample value and its immediately previous sample value is obtained in the sequential order to obtain a period jitter $J_p$. Regarding a series of obtained period jitters $J_p$, a root-mean-square value is calculated by a root-mean-square value calculating part 44. That is, a differential waveform of a sample phase noise waveform from the zero-crossing sampler 41 is calculated by the differential circuit 43, and the differential phase noise waveform is supplied to the root-mean-square value calculating part 44.

A detecting method of an approximate zero-crossing point in the zero-crossing point detecting part 42 will be explained. The maximum value of a waveform of an inputted real part $x_c(t)$ is defined as 100% level, and the minimum value is defined as 0% level to calculate 50% level V (50%) of the difference between the 100% level and the 0% level as a zero-crossing level. A difference between a sample value and 50% level V (50%) and a difference between its adjacent sample value and 50% level V (50%), i.e., $(x_c(j-1)-V(50\%))$ and $(x_c(j)-V(50\%))$ are calculated, and further a product of those difference values $(x_c(j-1)-V(50\%))\times(x_c(j)-V (50\%))$ is calculated. When the $x_c(t)$ crosses 50% level, i.e., zero level, the sign of its sample value $x_c(j-1)$ or $x_c(j)$ changes from a negative sign to a positive sign or from a positive sign to a negative sign. Therefore, when the product is negative, it is detected that the $x_c(t)$ has passed the zero level, and a time point j-1 or j at which a smaller absolute value of the sample value $x_c(j-1)$ or $x_c(j)$ is detected is obtained as an approximate zero-crossing point.

Further, the zero-crossing sampler 41, the differential circuit 43 and the root-mean-square calculating part 44 compose a root-mean-square value detecting part 45. In addition, the root-mean-square calculating part 44 performs a calculation of the following equation.

$$J_{\text{RMS}} = \sigma_J = \sqrt{\frac{1}{N}\sum_{n=0}^{N-1} J_p^2(n)}$$

This root-mean-square value $\sigma_j$ and the $\hat{J}_{pk}=2\Delta\phi_{max}$ from the two-multiplying part 38 are inputted to a probability calculating part 46 to calculate the aforementioned equation (3), i.e., the following equation.

$$P_r(J_p > \hat{J}_{pk}) = \exp\left(-\frac{\hat{J}_{pk}^2}{2\sigma_j^2}\right)$$

A result of this calculation is outputted to an output terminal 47 as a probability $P_r(J_p>\hat{J}_{pk})$ that a period jitter of the input signal exceeds the $\hat{J}_{pk}$ In this manner, an occurrence probability of period jitter of an input signal can be estimated. In addition, as mentioned above, $\Delta\phi_{max}$ can be obtained in relatively short time. Therefore, this probability can also be obtained in relatively short time. Further, since $\sigma_j^2$ is calculated by the probability calculating part 46, value $\sigma_j^2$ may be supplied, before an extrction of square root is applied thereto, to the probability calculating part 46.

Figures 7, 8:
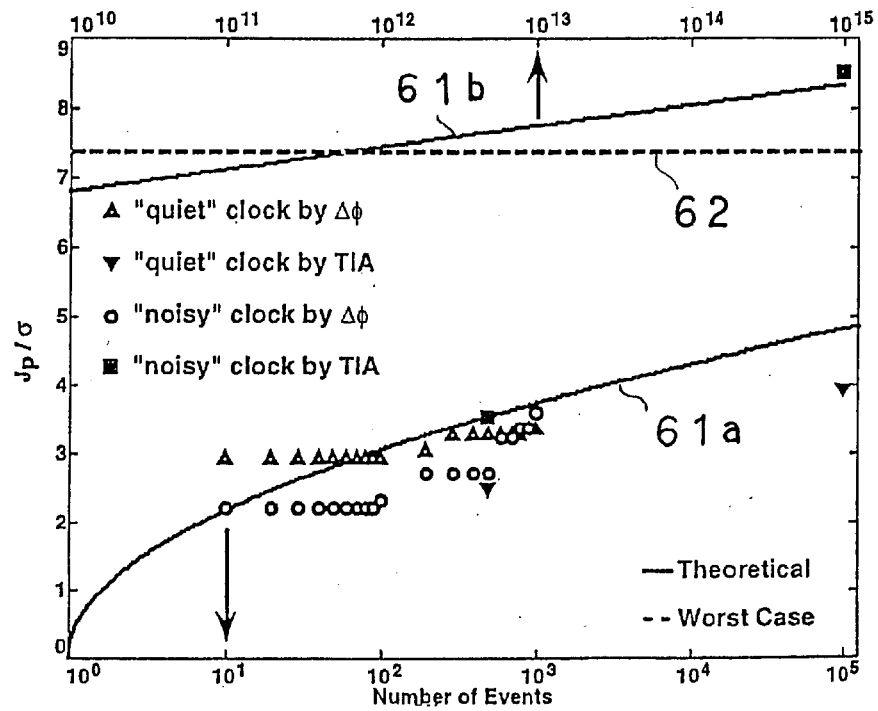
FIG. 7 is a diagram showing the number of zero-crossing points required for observing a certain value $J_{pp}$ of period jitter.
FIG. 8 is a diagram showing the worst period jitter values, the worst values obtained from peak values of $\Delta\phi(t)$, and the numbers of zero-crossing points used.

Next, an experimental example will be explained. FIG. 7 shows estimated values $\hat{J}_{pk}$ of peak values of period jitter and the number of zero-crossing points required for detecting the estimated values $\hat{J}_{pk}$ based on clock jitters J(nT) of a microprocessor of a personal computer. The axis of abscissa represents the number of zero-crossing points, and the axis of ordinate represents $J_{pp}/\sigma_j$ Curves 61a and 61b indicate theoretical values, which are values calculated from an inverse number of the probability $P_r(J_p>\hat{J}_{pk})$ obtained by the equation (3). The number of zero-crossing points of the curve 61a are represented by the lower axis of abscissa, and the number of zero-crossing points of the curve 61b are represented by the upper axis of abscissa. A triangle whose one apex is on its upper side indicates a peak value $\hat{J}_{pk}$ of period jitter of a clock in quiet mode obtained by the $\Delta\phi$ method, i.e., a measured maximum value of period jitter. A triangle whose one apex is on its lower side indicates a peak value $\hat{J}_{pk}$ of period jitter of a clock in quiet mode obtained by the time interval analyzed method. A mark ○ indicates a peak value $\hat{J}_{pk}$ of period jitter of a clock in noisy mode obtained by the $\Delta\phi$ method. A mark □ indicates a peak value $\hat{J}_{pk}$ of period jitter of a clock in noisy mode obtained by the time interval analyzed method. Furthermore, a dashed line 62 indicates, when $4\Delta\phi_{max}$ is defined as the worst value $J'_{pp}$, a value obtained by dividing the $J'_{pp}$ by $2\sigma_j$, i.e., $\hat{J}_{pp}/(2\sigma_j)$.

The peak values of period jitters substantially coincide with the ideal curve 61a except for the noisy mode $J'^*_p$ observed at the number of zero-crossing points $10^5$ of the mark □, and therefore it can be understood that the peak values substantially follow Rayleigh distribution. A distance between the $J'^*_p$ and the theoretical value is approximately ten times of $\sigma_{jpk}*/\sigma_j=0.655$ obtained from the equation (4).

The number of zero-crossing points at which the value of this $J'^*_p$ is obtained as the maximum peak value $J'_p$ corresponds to $10^5$. However, it is considered that the fact that the $J'^*_p$ is obtained at $10^5$ means that the noisy mode functions as a acceleration test against the quiet mode. In this manner, even if the noisy mode is used, according to the conventional time interval method, $10^5$ zero-crossing points are necessary to obtain the worst value $J'_{pp}$ of period jitter. However, according to the $\Delta\phi$ method of the present invention, $J_{pp}/\sigma_T$ (triangle whose one apex is on upper side) of a quiet mode clock substantially coincides with $J_p/\sigma_T$ (the mark □) of a noisy mode clock at a point of $10^3$ zero-crossing points, and at the same time, the $J_{pp}/\sigma_T$ has a value close to the ideal curve 61a. The $J'_{pp}/\sigma_j$ (worst value) at this time is the dashed line 62. That is, according to the conventional time interval analyzed method, $10^5$ zero-crossing points are necessary even in noisy mode to obtain the worst value of period jitter. However, according to the $\Delta\phi$ method of the present invention, $10^3$ zero-crossing points are sufficient, and hence it is understood that the measuring time by the $\Delta\phi$ method of the present invention is decreased to $\frac{1}{100}$ of that by the conventional method. calculating part 46, a value $\sigma_j^2$ may be supplied, before an extraction of square root is applied thereto, to the probability calculating part 46.

In addition, FIG. 8 shows peak-to-peak values (worst values) $J_{pp}$ of period jitter measured by the time interval method, peak values (maximum values) $\Delta\phi_p$ of timing jitter measured by the $\Delta\phi$ method of the present invention, the worst values $J_{pp}$ of period jitter estimated from those values, and their occurrence probabilities $P_r(J_p)$ with respect to the quiet mode and the noisy mode for all those data, and the number of events, i.e., zero-crossing points required for the measurements, all of which are obtained in the experiment. Regarding the values of $\Delta\phi_p$ in FIG. 8, there are shown a case in which the clock is phase-modulated by a jitter but is not amplitude-modulated (PM only) and a case in which the clock is phase-modulated by a jitter and is also amplitude-modulated (PM+AM).

According to the $\Delta\phi$ method, the maximum peak-to-peak value (the worst value) can also be obtained at the point of 997 zero-crossing points from FIG. 8. However, it is understood that according to the conventional time interval method, many zero-crossing points, such as 102000 zero-crossing points, are necessary. Further, in the time interval method, the value of $J_{pp}$ at the point of 500 zero-crossing points is significantly different from the value of $J_{pp}$ at the point of 102000 zero-crossing points, and hence it is understood that the value of $J_{pp}$ cannot correctly be measured at the point of 500 zero-crossing points.

In FIG. 5, the switches 32a and 32b may be switched to the zero-crossing sample 33 side so that a phase noise waveform $\Delta\phi(t)$ is sampled by a sampling pulse from the zero-crossing point detecting part 42 and the sample values are supplied to the worst value estimating part 31. Moreover, as indicated by a dashed line, a clock signal from the PLL circuit under test 11 is supplied to the AD converter 12 via a clipper 64 so that the amplitude of the clock signal is made constant, so that the phase noise waveform is not influenced by an amplitude modulation component, and hence a jitter can correctly be measured. This processing facility for making the amplitude of an input signal constant may be provided in output side of the AD converter 12 instead.

Figure 9:
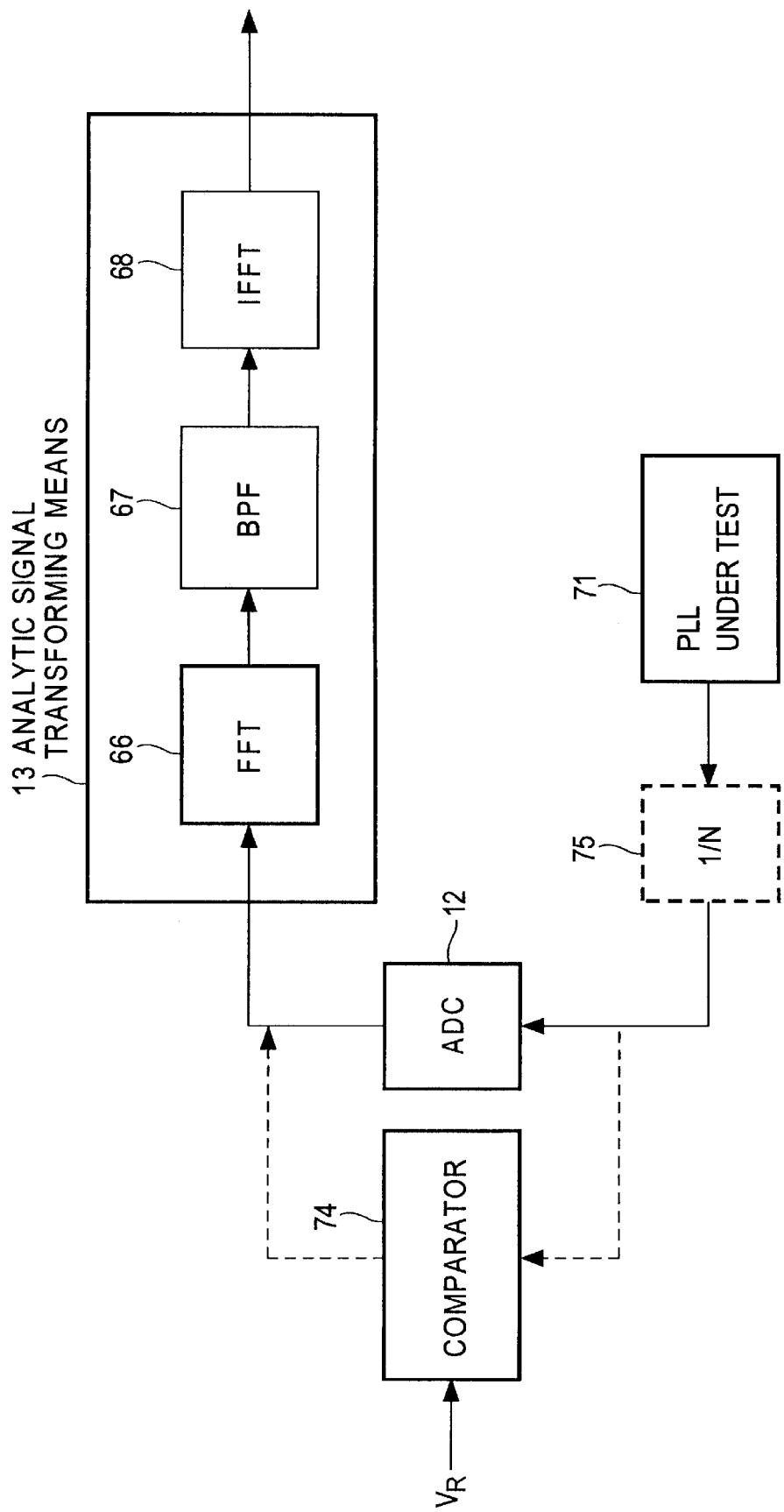
FIG. 9 is a diagram showing functional configuration of a partially modified example of the present invention.

In the means 13 for transforming an input signal into an analytic signal $z_c(t)$, as shown in FIG. 9, an inputted digital signal is Fourier-transformed by an FFT part 66, and negative frequency components are cut off from the transformed output by a bandpass filter 67 to extract a fundamental wave of the input clock signal only. Then the output of the bandpass filter 67 is inverse-Fourier-transformed by an inverse FFT part 68 to obtain an analytic signal $z_c(t)$.

Figure 10:
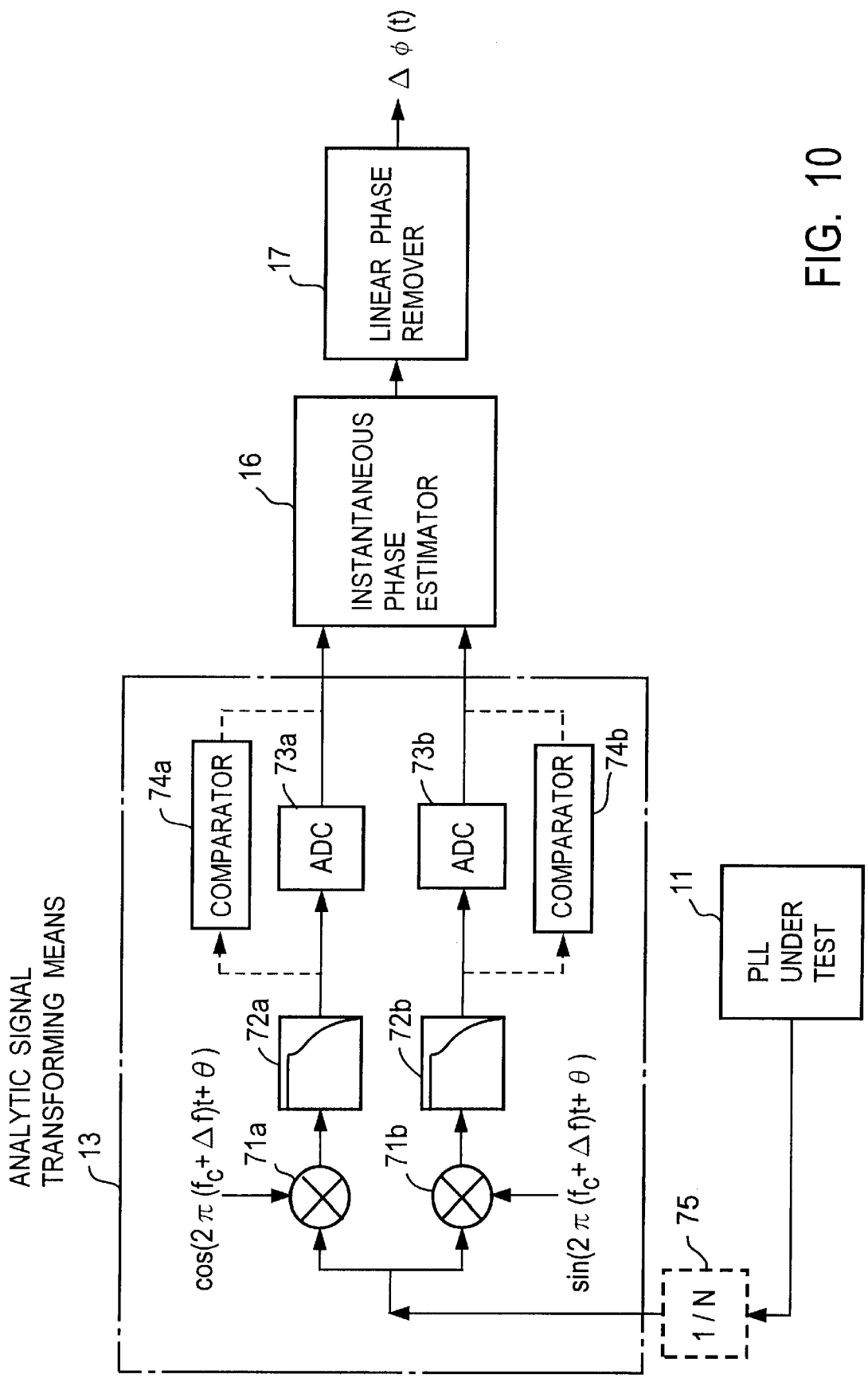
FIG. 10 is a diagram showing functional features of another partially modified example of the present invention

Alternatively, as shown in FIG. 10, an input clock signal $x_c(t)$ is mixed with $\cos(2\pi(f_c+\Delta f)t+\theta)$ and $\sin(2\pi(f_c+\Delta f)t+\theta)$ in frequency mixers 71a and 71b, respectively. Then difference frequency components are extracted from the outputs of the frequency mixers 71a and 71b, respectively to obtain an analytic signal $z_c(t)$ expressed by the following equation.

$$z_c(t)=(A_c/2)[\cos(2\pi\Delta ft+(\theta-\theta_c)-\Delta\phi(t))+j\sin(2\pi\Delta ft+(\theta-\theta_c)-\Delta\phi(t))]$$

A real part and an imaginary part of the above equation are converted into digital signals by AD converters 73a and 73b respectively, and those digital signals are supplied to an instantaneous phase estimator 16.

In the aforementioned configuration, a comparator may be used instead of the AD converter. That is, as indicated by a dashed line in FIG. 9 for example, a comparator 74 may be used to convert the input signal to a signal representing that the input signal is equal to or greater than a reference level or the input signal is smaller than the reference level, namely to one bit digital signal. In addition, as indicated by dashed lines in FIG. 10, comparators 74a and 74b may be used instead of the AD converters 73a and 73b, respectively.

In order to supply a clock signal with its decreased frequency to the analytic signal transforming means 13, as indicated by dashed lines in FIGS. 9 and 10, the clock signal frequency may be frequency-divided by a frequency divider 75 to supply the frequency-divided clock signal to the analytic signal transforming means 13. Alternatively, although not illustrated, the clock signal may be converted, using substantially jitter-free local signal, into a difference frequency signal between those signals by a frequency converter to supply the difference frequency signal to the analytic signal transforming means 13. One or more functions of each functional configuration of the apparatus shown in FIGS. 5, 9 and 10 may also be performed by decoding and executing programs in a computer.

In the aforementioned description, there has been explained, as a signal under test, a case of clock signal of a microprocessor. However, the present invention can be applied to an estimation of the worst value of period jitter or an estimation of a probability of period jitter of a clock signal or another signal such as a sine wave signal or the like used in other devices.

As mentioned above, according to the present invention, the maximum value $\Delta\phi_{max}$ of timing jitter of an input signal is estimated by the $\Delta\phi$ method, and then a two-time value or a four-time value of the maximum value is defined as the worst value of period jitter of the input signal. On the other hand, since a peak value of jitter is a random variable, the worst value of period jitter can be obtained in a significantly short time according to the present invention compared with the conventional method for estimating the positive side maximum value of period jitter and the negative side maximum value of period jitter to obtain the worst value. Therefore, it can actually be possible to test whether or not the worst value of period jitter of an operation clock of, for example, a semiconductor integrated circuit is equal to or less than a predetermined value to determine if the product is a defective article.

In addition, according to the present invention, the maximum value $\Delta\phi_{max}$ of timing jitter of an input signal is estimated by the $\Delta\phi$ method, and then a period jitter is obtained from a differential value between zero-crossing samples of $\Delta\phi(t)$. Using a two-time value of the maximum value $\Delta\phi_{max}$ of timing jitter and a mean-square value of the period jitters, a probability of period jitter of an input signal can be obtained. Since there has not been available a method for obtaining such a probability, it has not been sure in what probability, for example, a period jitter of an operation clock of a device exceeds a set value. However, according to the present invention, such a thing can be made sure, and a level of reliability of a product can be checked.

What is claimed is:

1. An apparatus for measuring a peak jitter comprising:
    analytic signal transforming means for transforming an input signal into a complex analytic signal;
    instantaneous phase estimating means for obtaining an instantaneous phase of the analytic signal;
    linear phase removing means for removing a linear phase from the instantaneous phase to obtain a phase noise waveform;
    peak detecting means for obtaining the maximum value of absolute values of the phase noise waveform as a peak value; and
    worst value estimating means for obtaining the worst value of period jitter of the input signal from the peak value to output the worst value.

2. The apparatus for measuring a peak jitter according to claim 1 wherein said worst value estimating means is means for multiplying the peak value by 2 to output the multiplied value as the worst value.

3. The apparatus for measuring a peak jitter according to claim 1 wherein said worst value estimating means is means for multiplying the peak value by 4 to output the multiplied value as the worst value.

4. The apparatus for measuring a peak jitter according to claim 1 further including:
    zero-crossing sampling means for inputting thereto the phase noise waveform and for sampling the phase noise waveform at a timing close to a zero-crossing timing of a real part of the analytic signal to output a sample output; and
    switching means for switching a signal path of the phase noise waveform from said linear phase removing means so that the sample output from said zero-crossing sampling means is supplied to said peak detecting means.

5. The apparatus for measuring a peak jitter according to claim 1 further including:
    clipping means for removing amplitude-modulation components from the input signal to supply the input signal from which the amplitude-modulation components have been removed to said analytic signal transforming means.

6. The apparatus for measuring a peak jitter according to claim 2 further including:
    mean-square value detecting means for inputting thereto the phase noise waveform to obtain a mean-square jitter of the period jitters; and
    probability calculating means for inputting thereto the worst value and the mean-square jitter to obtain and output a probability that the period jitter exceeds the worst value.

7. The apparatus for measuring a peak jitter according to claim 6 wherein said mean-square value detecting means comprises:
    zero-crossing sampling means for sampling the phase noise waveform at a timing close to a zero-crossing timing of a real part of the analytic signal to extract a sample output;
    differential means for calculating a differential waveform of the sampled phase noise waveform to obtain the period jitter; and
    mean-square value detecting means for calculating a mean-square value of the period jitters to obtain the mean-square jitter.

8. A method of measuring a peak jitter comprising the steps of:
    transforming an input signal into a complex analytic signal;
    obtaining an instantaneous phase of the analytic signal;
    removing a linear phase from the instantaneous phase to obtain a phase noise waveform;
    obtaining the maximum value of absolute values of the phase noise waveform as a peak value; and
    obtaining the worst value of period jitter of the input signal from the peak value.

9. The method of measuring a peak jitter according to claim 8 wherein said step of obtaining the worst value is a step of multiplying the peak value by 2 to obtain the multiplied value as the worst value.

10. The method of measuring a peak jitter according to claim 8 wherein said step of obtaining the worst value is a step of multiplying the peak value by 4 to obtain the multiplied value as the worst value.

11. The method of measuring a peak jitter according to claim 8 further including the step of:
    removing amplitude-modulation components from the input signal prior to transforming the input signal into the analytic signal.

12. The method of measuring a peak jitter according to claim 9 further including the steps of:
    obtaining a mean-square jitter of the period jitters from the phase noise waveform; and
    calculating a probability that the period jitter exceeds the worst value from the worst value and the mean-square jitter.

13. The method of measuring a peak jitter according to claim 12 said step of obtaining the mean-square jitter comprises the steps of:
    sampling the phase noise waveform at a timing close to a zero-crossing timing of a real part of the analytic signal to extract a sample output; and
    calculating a differential waveform of the phase noise waveform sampled in said sampling step to obtain the period jitter; and
    calculating a mean-square value of the period jitters to obtain the mean-square jitter.

* * * * *